United States Patent
Kimura (10) Patent No.: US 7,144,160 B2
(45) Date of Patent: Dec. 5, 2006

(54) HYDRODYNAMIC BEARING APPARATUS AND STAGE APPARATUS USING THE SAME

(75) Inventor: Atsushi Kimura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 184 days.

(21) Appl. No.: 10/957,837

(22) Filed: Oct. 5, 2004

(65) Prior Publication Data

US 2005/0084187 A1   Apr. 21, 2005

(30) Foreign Application Priority Data

Oct. 16, 2003   (JP)   ............... 2003-356630

(51) Int. Cl.
*F16C 29/00*   (2006.01)
(52) U.S. Cl. ..................... 384/12; 384/10
(58) Field of Classification Search ............. 384/8, 384/12, 15; 355/53
See application file for complete search history.

(56) References Cited

U.S. PATENT DOCUMENTS

| | | | |
|---|---|---|---|
| 4,413,863 A * | 11/1983 | Lombard | ............... 384/8 |
| 4,993,696 A | 2/1991 | Furukawa et al. | ............... 269/73 |
| 5,040,431 A | 8/1991 | Sakino et al. | ............... 74/479 |
| 5,098,203 A | 3/1992 | Henderson | ............... 384/12 |
| 5,656,942 A | 8/1997 | Watts et al. | ............... 324/754 |
| 6,128,069 A | 10/2000 | Korenaga | ............... 355/53 |
| 6,467,960 B1 * | 10/2002 | Watson et al. | ............... 384/12 |
| 6,654,100 B1 * | 11/2003 | Yoda | ............... 355/53 |
| 2002/0176061 A1 | 11/2002 | Sai | ............... 355/53 |
| 2003/0156270 A1 | 8/2003 | Hunter | ............... 355/72 |

FOREIGN PATENT DOCUMENTS

| | | |
|---|---|---|
| JP | 6-241230 | 8/1994 |
| JP | 10-256111 | 9/1998 |
| JP | 2002-257138 | 9/2002 |
| JP | 2002-349569 | 12/2002 |

OTHER PUBLICATIONS

European Search Report dated Jan. 12, 2006, issued in corresponding European patent application No. EP 04 25 6311, forwarded in a Communication dated Feb. 3, 2006.

* cited by examiner

*Primary Examiner*—Thomas R. Hannon
(74) *Attorney, Agent, or Firm*—Fitzpatrick, Cella, Harper & Scinto

(57) ABSTRACT

A plurality of preload magnet units are arranged on each side of a hydrodynamic bearing symmetrically. Preload magnet units are arranged inside a labyrinth partition to surround the hydrodynamic bearing in a non-air atmosphere.

10 Claims, 9 Drawing Sheets

HYDRODYNAMIC BEARING APPARATUS AND STAGE APPARATUS USING THE SAME

FIELD OF THE INVENTION

The present invention relates to a hydrodynamic bearing apparatus and, preferably, a hydrodynamic bearing apparatus used in a stage apparatus for an exposure apparatus.

BACKGROUND OF THE INVENTION

An exposure apparatus used in a process of manufacturing devices, such as a semiconductor device and a liquid crystal display device, has a stage which moves a master such as a mask or reticle, or a substrate to be exposed such as a semiconductor wafer or glass substrate (these will be generally referred to as substrates hereinafter). The stage is supported (guided) by, e.g., a hydrodynamic bearing.

Figure 6:
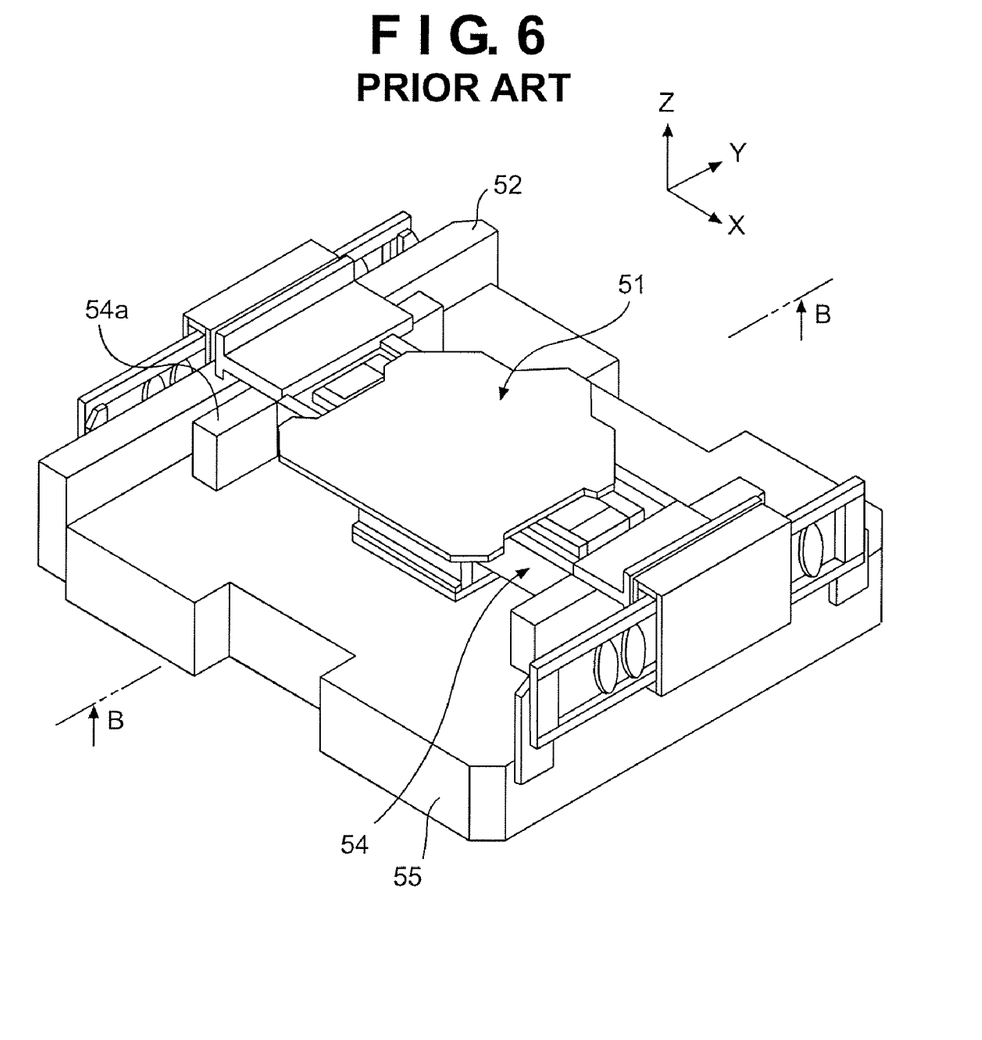
FIG. 6 is a schematic perspective view of a conventional stage apparatus.
Figure 7:
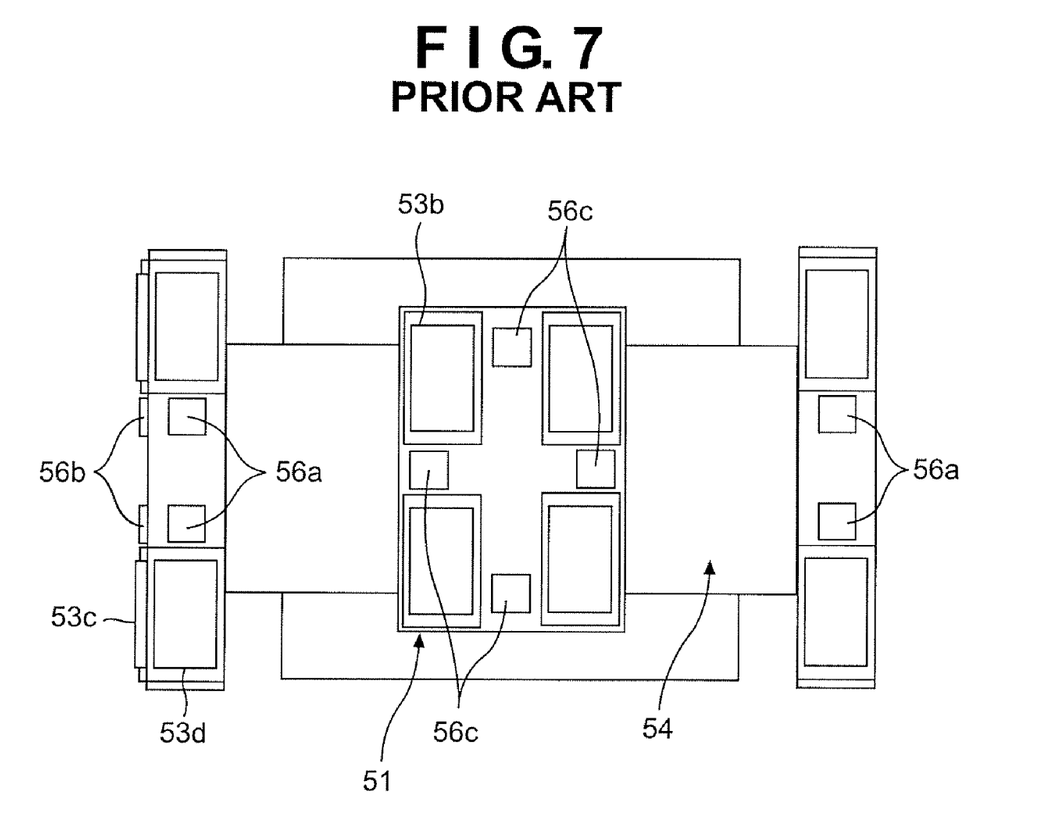
FIG. 7 is a sectional view taken along the line B—B of FIG. 6.

As a stage apparatus which uses a conventional hydrodynamic bearing, for example, one as shown in Japanese Patent Laid-Open No. 10-256111 is available (see FIG. 6). Referring to FIG. 6, an X stage 51 and Y stage 54 are movable along a surface plate 55, and the bottom surfaces of the X stage 51 and Y stage 54 are supported by hydrostatic bearings (hydrodynamic bearings). The Y stage 54 can move in the Y direction along a stationary guide 52, and the side surface of the Y stage 54 is supported by hydrostatic bearings. FIG. 7 is a sectional view, seen from the positive direction along the Z-axis, of a surface that opposes the stages 51 and 54 and surface plate 55. The X stage 51 is supported by hydrostatic bearings 53b to be in non-contact with the surface plate 55, and the Y stage 54 is supported by hydrostatic bearings 53c and 53d to be in non-contact with the surface plate 55 and stationary guide 52. The X stage 51 and Y stage 54 are provided with magnet units 56a, 56b, and 56c which apply a preload force to stabilize the gaps of the hydrostatic bearings.

As a stage apparatus that uses a hydrostatic bearing in a vacuum atmosphere, one as shown in, e.g., Japanese Patent Laid-Open No. 2002-257138, is available. Japanese Patent Laid-Open No. 2002-257138 discloses a mechanism in which a movable body is supported in a high vacuum by using a static pad, and a labyrinth portion having an exhaust groove is formed around the static pad.

When the magnet units 56a are arranged only near the centers in the longitudinal direction of hydrostatic bearing attaching plates 54a, as shown in FIG. 7, the acting point of the repulsive force of hydrostatic air and those of attracting forces generated by the preload magnet units are different, and the bearing surfaces of the hydrostatic bearing attaching plates 54a and surface plate 55 deform undesirably. This deformation partially decreases the gap between the hydrostatic bearings 53d and surface plate 55, and the hydrostatic bearings 53d and surface plate 55 may come into contact with each other in the worst case.

In recent years, the stage apparatus is sometimes used in a non-air atmosphere such as a vacuum atmosphere. A labyrinth partition is formed around a hydrostatic bearing so that air will not leak outside. Therefore, the attaching plate or stage becomes large, and its deformation amount also increases accordingly. In addition, degassing from a preload force biasing means which biases a preload force must also be taken into consideration.

SUMMARY OF THE INVENTION

The present invention has been made in view of the above problems, and has as its object to provide a hydrodynamic bearing apparatus in which deformation caused in a constituent element such as a moving body or guide by a force applied by a hydrodynamic bearing and a preload force biased by a preload force biasing means is decreased.

In order to achieve the above object, a hydrodynamic bearing apparatus for supporting a moving body with respect to a guide comprises a hydrodynamic bearing which is provided to the moving body and sprays a pressurized fluid to the guide, and preload force biasing means for generating a preload force between the moving body and guide, wherein the preload force biasing means is arranged dividedly around the hydrodynamic bearing.

A hydrodynamic bearing apparatus for supporting a moving body with respect to a guide comprises a hydrodynamic bearing which is provided to the moving body and sprays a pressurized fluid to the guide, and preload force biasing means for generating a preload force between the moving body and guide, wherein the preload force biasing means includes a plurality of preload force biasing means arranged on each side of at least a uni-axial direction on the hydrodynamic bearing symmetrically, to achieve the above object. Desirably, the preload force biasing means is dividedly arranged around the hydrodynamic bearing, so that the plurality of preload force biasing means are arranged on each side of at least the uni-axial direction on the hydrodynamic bearing symmetrically.

When the hydrodynamic bearing is to be used in a non-air atmosphere, desirably, the hydrodynamic bearing apparatus has a labyrinth partition to surround the hydrodynamic bearing, and the preload force biasing means is arranged inside the labyrinth partition. In particular, when the labyrinth partition includes a plurality of labyrinth partitions, the preload force biasing means is desirably arranged inside one of the labyrinth partitions which is the closest to the hydrodynamic bearing.

The guide may have a magnetic body portion, and the preload force biasing means may generate a magnetic force with respect to the guide, thus biasing a preload force. As the preload force biasing means, for example, a permanent magnet is enumerated.

When a permanent magnet is used as the preload force biasing means in a non-air atmosphere, a height of the permanent magnet in a support direction is desirably equal to or smaller than a height of the labyrinth partition, provided to the moving body, in the support direction.

The hydrodynamic bearing apparatus is desirably used in a stage apparatus, particularly, in a stage apparatus that positions a substrate in an exposure apparatus.

A "hydrodynamic bearing" means a portion which sprays a pressurized fluid, and can be replaced with, e.g., a hydrostatic pad.

A "labyrinth partition" can be replaced with the step portion of a known labyrinth mechanism (e.g., see Japanese Patent Laid-Open No. 2002-257138).

According to the present invention, deformation occurring in a constituent member such as a moving body or guide by a force applied by a fluid bearing and a preload force generated by a preload force biasing means can be decreased.

According to the invention of the second aspect, the influence of deformation can be effectively decreased in a uni-axial direction. When both the inventions of the first and second aspects are employed, deformation can be decreased further effectively.

According to the invention of the third aspect, when gases degassing from the preload force biasing means are not released in the non-air atmosphere, the influence of degassing, such as deterioration of the atmosphere, can be decreased, and the deformation of the structure can be decreased. Also, the invention of the fourth aspect can decrease the influence of degassing more effectively.

According to the invention of the fifth aspect, the preload force can be biased even in a vacuum atmosphere. When a permanent magnet is used as a preload force biasing means, it can be machined, e.g., divided, easily.

According to the invention of the seventh aspect, exhaust of fluid discharged from the hydrodynamic bearing apparatus can be prevented from being interfered with, to stabilize the bearing gaps.

When the hydrodynamic bearing apparatus is applied to a stage apparatus, high-accuracy alignment can be performed. An exposure apparatus that employs the stage apparatus can perform high-accuracy exposure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

First Embodiment

Figure 1:
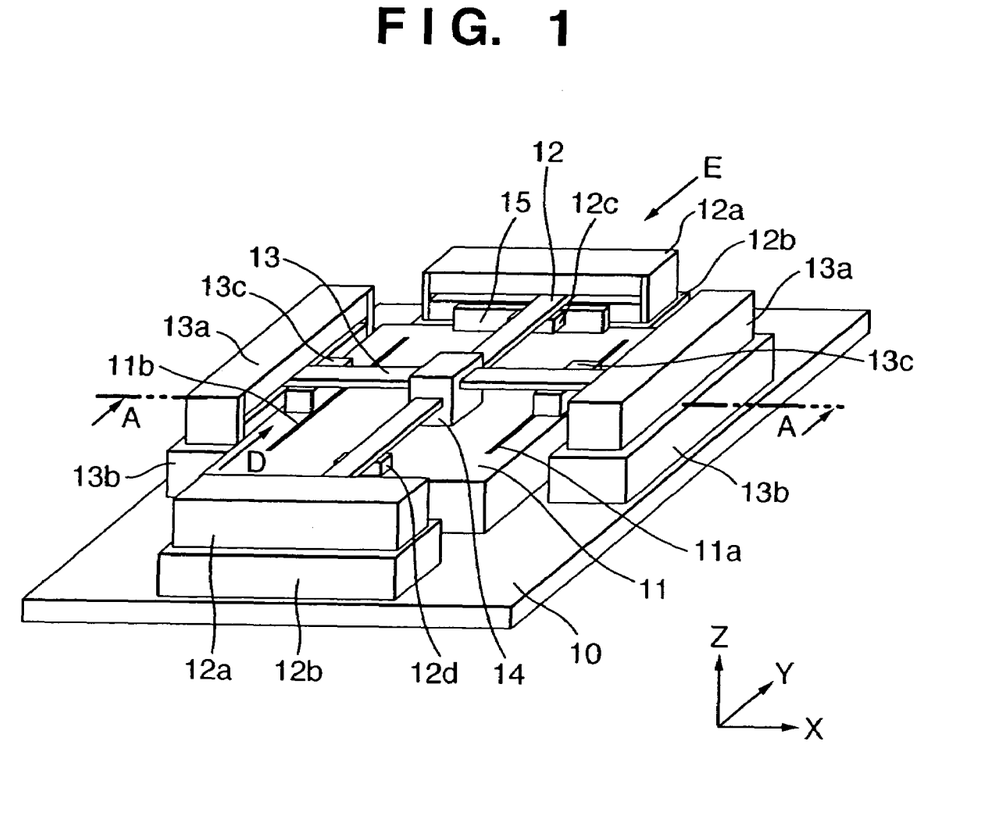
FIG. 1 is a schematic perspective view showing a stage apparatus according to the present invention.

FIG. 1 is a schematic perspective view showing a wafer stage according to the first embodiment. A stage surface plate 11 made of a magnetic body is mounted at the central portion of a base surface plate 10. A pair of X surface plates 12b for placing thereon a pair of linear motor stators 12a which drive an X beam 12 in the X direction, and a pair of Y surface plates 13b for placing thereon a pair of linear motor stators 13a which drive a Y beam 13 in the Y direction are mounted around the stage surface plate 11. An X-Y slider 14 is arranged where the X and Y beams 12 and 13 intersect, and the respective beams 12 and 13 extend through the X-Y slider 14.

The X and Y beams 12 and 13, and the X-Y slider 14 are supported at their extending portions to be in non-contact with each other (not shown), and the X-Y slider 14 is supported on the base surface plate 10 to be in non-contact with the base surface plate 10. Thus, when the beam is driven, the X-Y slider 14 can move in the X or Y direction. A fine-movement stage (not shown) which finely moves in six-axis directions is mounted on the X-Y slider 14. A wafer chuck which holds a wafer is arranged on the fine-movement stage.

Y-attaching plates 13c are arranged at the two ends of the Y beam 13. Hydrostatic pneumatic bearings 131 (see FIG. 2) serving as hydrodynamic bearings are arranged on the bottom surfaces of the Y-attaching plates 13c. The hydrostatic pneumatic bearings 131 guide the Y-attaching plates 13c in the vertical direction (Z-axis direction) with respect to the stage surface plate 11. Similarly, X-attaching plates 12c and 12d are arranged at the two ends of the X beam 12. Hydrostatic pneumatic bearings 121 (see FIG. 2) at the bottoms of the X-attaching plates 12c and 12d guide the X-attaching plates 12c and 12d in the vertical direction (Z-axis direction) with respect to the stage surface plate 11.

The X-attaching plate 12c is also guided by hydrostatic pneumatic bearings (not shown) in the horizontal direction (Y-axis direction) with respect to a stationary guide 15 attached to the stage surface plate 11. The X-Y slider 14 is guided by hydrostatic pressure pneumatic bearings 141 arranged on its bottom surface in the vertical direction (Z-axis direction) with respect to the stage surface plate 11.

Figure 2:
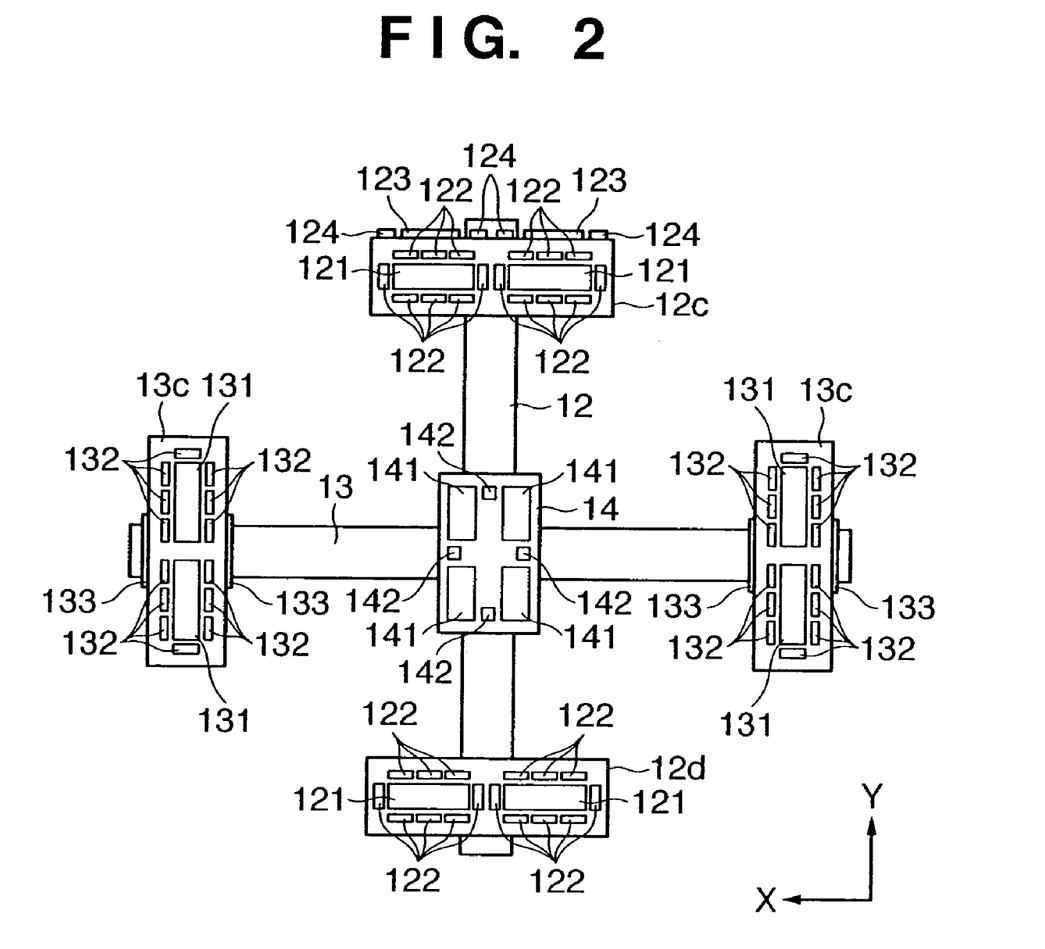
FIG. 2 is a sectional view taken along the line A—A of FIG. 1.
Figure 3:
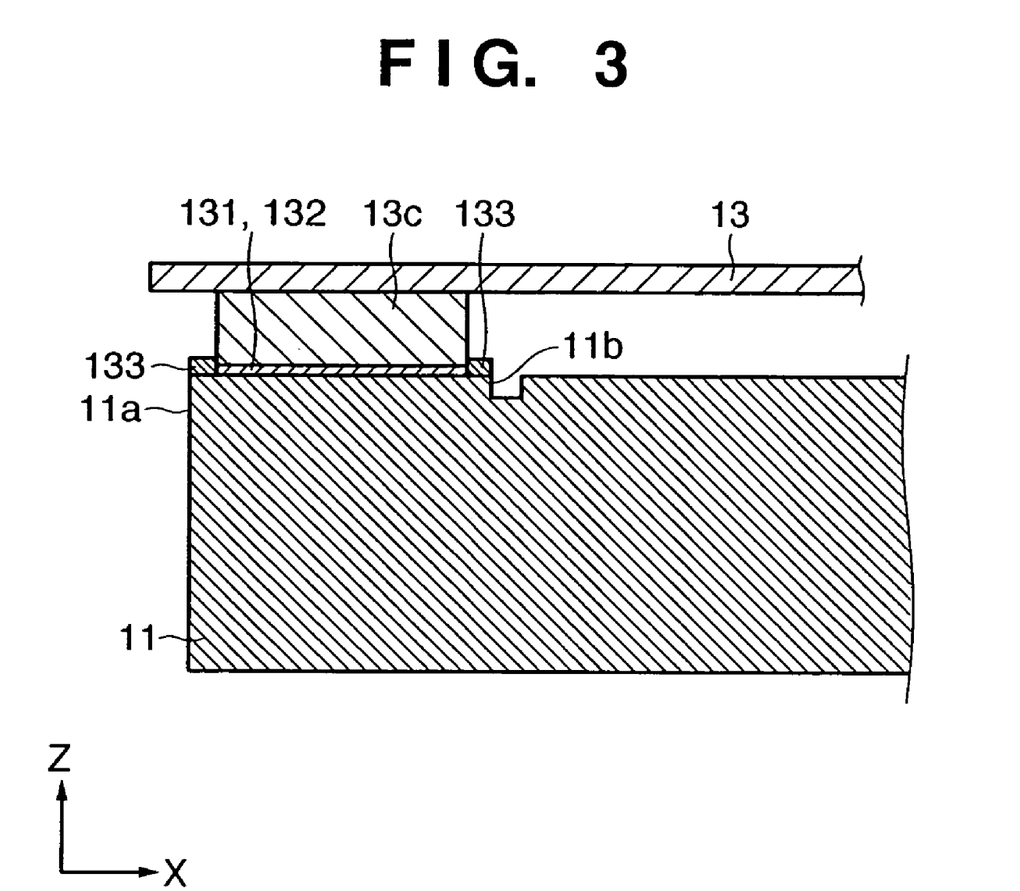
FIG. 3 is a view showing a portion in the vicinity of a guide.

The hydrostatic pneumatic bearings will be described. FIG. 2 is a sectional view taken along the line A—A of FIG. 1, and FIG. 3 is a view seen from a direction of an arrow D of FIG. 1. As described above, the porous hydrostatic pneumatic bearings 121 are arranged on the lower surfaces of the X-attaching plates 12c and 12d, to levitate the X-attaching plates 12c and 12d with respect to the stage surface plate 11. Similarly, the hydrostatic pneumatic bearings 131 and 141 are arranged on the lower surfaces of the Y-attaching plates 13c and X-Y slider 14, to levitate the Y-attaching plates 13c and X-Y slider 14 with respect to the stage surface plate 11.

To stabilize the bearing gaps, preload magnet units 122 serving as a preload force biasing means are arranged on the bottom surfaces of the X-attaching plates 12c and 12d dividedly around the hydrostatic pneumatic bearings. The plurality of preload magnet units 122 are arranged symmetrically (on each of the two sides or ends) on the hydrostatic pneumatic bearings 121 in a direction (Y-axis direction) perpendicular to the longitudinal direction. An attracting force acts between the preload magnet units 122 and the stage surface plate 11 serving as the magnetic body. The preload magnet units 122 are arranged dividedly in a plurality of groups so as to distribute the preload force (attracting force). When the plurality of preload magnet units 122 are arranged dividedly and symmetrically (on each of the two sides or ends) on each hydrostatic pneumatic bearing in a target direction in which deformation is to be suppressed, deformation can be decreased effectively. The bearing gaps can be adjusted by adjusting the respective preload forces of the plurality of preload force biasing means which are arranged dividedly. When the preload magnet units 122 are arranged to surround the hydrostatic pneumatic bearings 121, deformation of the constituent members can be further suppressed. If permanent magnets are used as the preload force biasing means, the preload force biasing means can be divided easily as they can be machined easily, leading to an advantage in machining cost as well.

Similarly, regarding the Y-attaching plates 13c, preload magnet units 132 are provided to the hydrostatic pneumatic bearings 131. Note that the preload magnet units 132 are not arranged at the central portions in the longitudinal direction (Y direction) of the Y-attaching plates 13c. This is due to the following reason. X-guide magnet units 133 to guide in the X-axis direction are provided to the Y-attaching plates 13c. When the attracting forces of the X-guide magnet units 133 are considered, the deformation amount becomes smaller if no preload magnet units are arranged at the central portions in the longitudinal direction of the Y-attaching plates 13c.

As shown in FIG. 3, when the Y-attaching plate 13c is to shift in the X-axis direction, due to the attracting force with respect to the stage surface plate 11 as the magnetic body, the X-guide magnet units 133 serve such that the Y-attaching plate 13c will not move beyond an end face 11a or groove side surface 11b of the stage surface plate 11. The Y beam 13 is provided with the X-guide magnet units 133 because it has no horizontal guides. The X-guide magnet units 133 also have the function of preload magnets. If a firm horizontal guide (stationary guide 15) similar to that of the X beam 12 is provided to the Y beam 13, the Y-attaching plate 13c will be constrained excessively unless the perpendicularity of the two beams 12 and 13 is zero. The Y-attaching plate 13c is guided weakly by providing the X-guide magnet units 133 as described above.

The X beam 12 is guided in the Y-axis direction by the stationary guide 15 and hydrostatic pneumatic bearings 123. The X beam 12 is similarly provided with preload magnet units 124.

Second Embodiment

Figure 4:
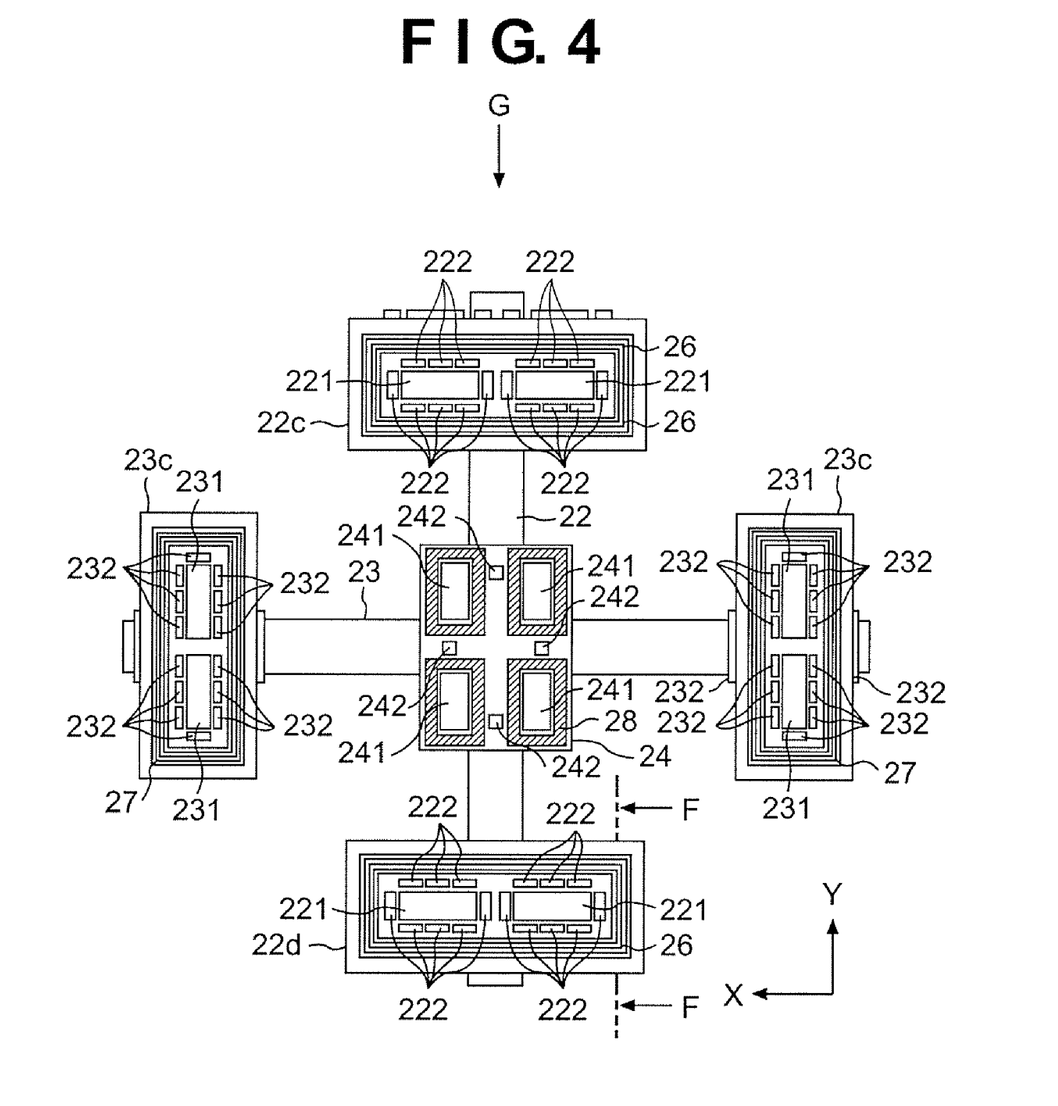
FIG. 4 is a view showing the second embodiment.

FIG. 4 is a view showing the second embodiment. The major difference between the first and second embodiments is that the second embodiment can be used in a vacuum atmosphere. The overall perspective view of the second embodiment is not largely different from FIG. 1, and will be omitted accordingly. In FIG. 4, a detailed description on portions that have the same functions as those of FIG. 2 will be omitted. Hydrostatic pneumatic bearings 221 are arranged on the bottom surface of each of X-attaching plates 22c and 22d, and preload magnet units 222 are arranged to surround the hydrostatic pneumatic bearings 221. A labyrinth partition 26 is formed around the preload magnet units 222. Hydrostatic pneumatic bearings 231 are arranged on the bottom surface of each Y-attaching plate 23c, and preload magnet units 232 are arranged to surround the hydrostatic pneumatic bearings 231. A labyrinth partition 27 is formed around the preload magnet units 232. The layout of the preload magnet units 222 and 232 with respect to the hydrostatic pneumatic bearings 221 and 231 is similar to that of the first embodiment. According to the characteristic feature of the second embodiment, the preload magnet units 222 and 232 are arranged inside the labyrinth partitions 26 and 27, respectively.

Figure 5:
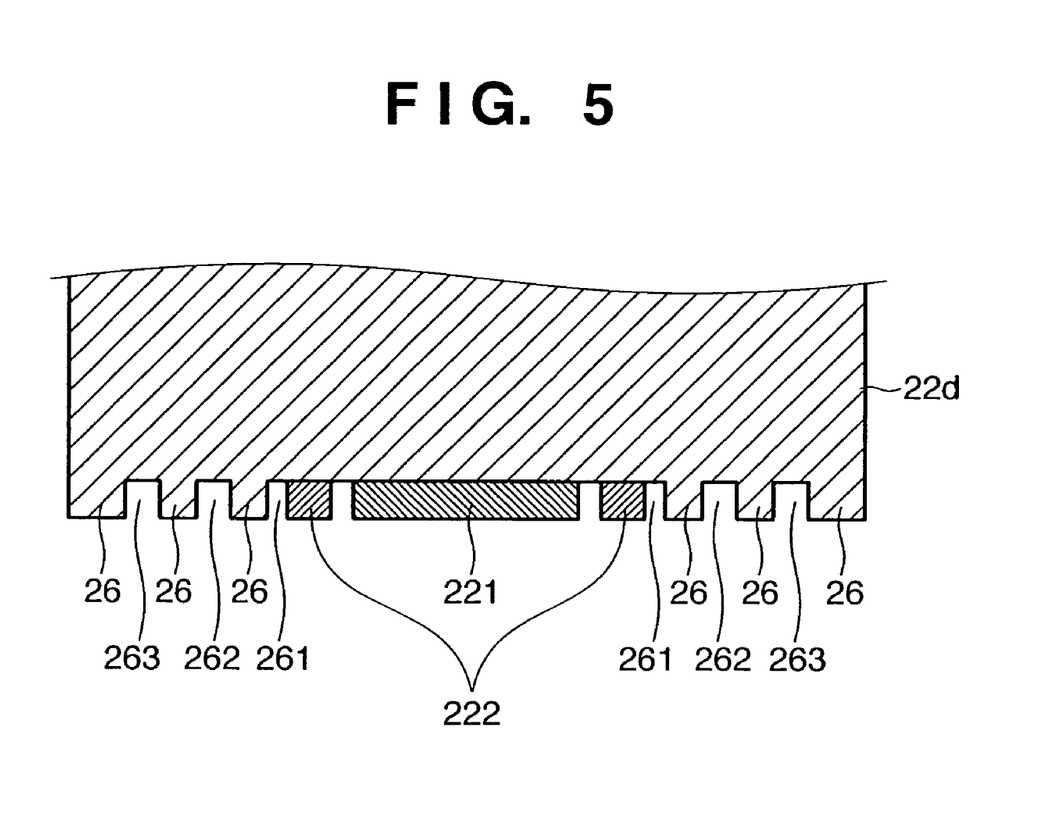
FIG. 5 is a sectional view taken along the line F—F of FIG. 4.

FIG. 5 is a sectional view taken along the line F—F of FIG. 4, and shows the labyrinth partition 26 in detail. The labyrinth partition 26 includes a plurality of labyrinth partitions. The plurality of labyrinth partitions are arranged to define labyrinth pockets 261, 262, and 263. Air spraying from the hydrostatic pneumatic bearings 221 is exhausted from an exhaust portion (not shown) formed inside (the first-stage labyrinth pocket 261) a labyrinth partition closest to the bearings, and is discharged outside the chamber through an exhaust channel (not shown).

Air that cannot be discharged completely with the first-stage labyrinth pocket 261 is exhausted from an exhaust portion formed in the second-stage labyrinth pocket 262. A small amount or air that cannot be exhausted completely with the second-stage labyrinth pocket 262 is exhausted from an exhaust portion formed in the third-stage labyrinth pocket 263. When a plurality of labyrinth partitions and a plurality of stages of labyrinth pockets are formed in this manner, air spraying from the hydrostatic pneumatic bearings 221 is prevented from leaking into the vacuum atmosphere.

The preload magnet units 222 are arranged in the first-stage labyrinth pocket 261 dividedly around the hydrostatic pneumatic bearings 221. The plurality of preload magnet units 222 are arranged symmetrically (on each of the two sides or ends) on the hydrostatic pneumatic bearings 221 in a direction (Y-axis direction) perpendicular to the longitudinal direction. An attracting force acts between the preload magnet units 222 and the stage surface plate 11 serving as the magnetic body. The preload magnet units 222 are arranged dividedly in a plurality of groups so as to distribute the preload force (attracting force). When the plurality of preload magnet units 222 are arranged dividedly and symmetrically (on each of the two sides or ends) on each hydrostatic pneumatic bearing in a target direction in which deformation is to be suppressed, deformation can be decreased effectively. The bearing gaps can be adjusted by adjusting the respective preload forces of the plurality of preload force biasing means which are arranged dividedly. When the preload magnet units 222 are arranged to surround the hydrostatic pneumatic bearings 221, deformation of the constituent members can be further suppressed. If permanent magnets are used as the preload force biasing means, the preload force biasing means can be divided easily as they can be machined easily, leading to an advantage in machining cost as well.

Considering use in a vacuum, when the preload magnet units 222 are located in the first-stage labyrinth pocket 261, it is preferable in exhausting the out-gas of the magnets. When the preload magnet units 222 are arranged such that their heights in the support direction (Z direction) are equal to or lower than that of the labyrinth partition 261, they can apply a preload force without interfering with the effect of the labyrinth partition. Then, the bearing gaps are stabilized.

In a vacuum atmosphere, a preload cannot be biased by gas attraction. Hence, it makes sense to bias a preload force by using a magnetic force in this manner.

This structure applies to the bottom surfaces of the X-attaching plate 22c and Y-attaching plates 23c, and the description for them will be omitted accordingly. Regarding an X-Y slider 24, labyrinth partitions 28 are provided to four hydrostatic pneumatic bearings 241, respectively. If preload magnet units 242 are to be arranged around each hydrostatic pneumatic bearing 241, a large space will be required. Thus, the preload magnet units 242 are arranged outside the labyrinth partitions 28, respectively, as shown in FIG. 4. In this manner, it should be understood that, although design factors must be considered, the present invention exhibits its effect by practicing it locally for a portion where deformation is to be suppressed.

Although this embodiment is an application in a vacuum atmosphere, the present invention can also be applied to a non-air atmosphere. The non-air atmosphere is an atmosphere filled with, e.g., helium or nitrogen. The actuating fluid for the hydrostatic pneumatic bearings is not limited to air, but can be helium or nitrogen as described above.

As the structure of a hydrostatic pneumatic bearing that can be used in a vacuum atmosphere, for example, one disclosed in Japanese Patent Laid-Open No. 2002-349569 is available. This disclosure, however, does not include devices such as arranging preload magnet units dividedly, and does not deny the novelty of the present invention.

Third Embodiment

Figure 8:
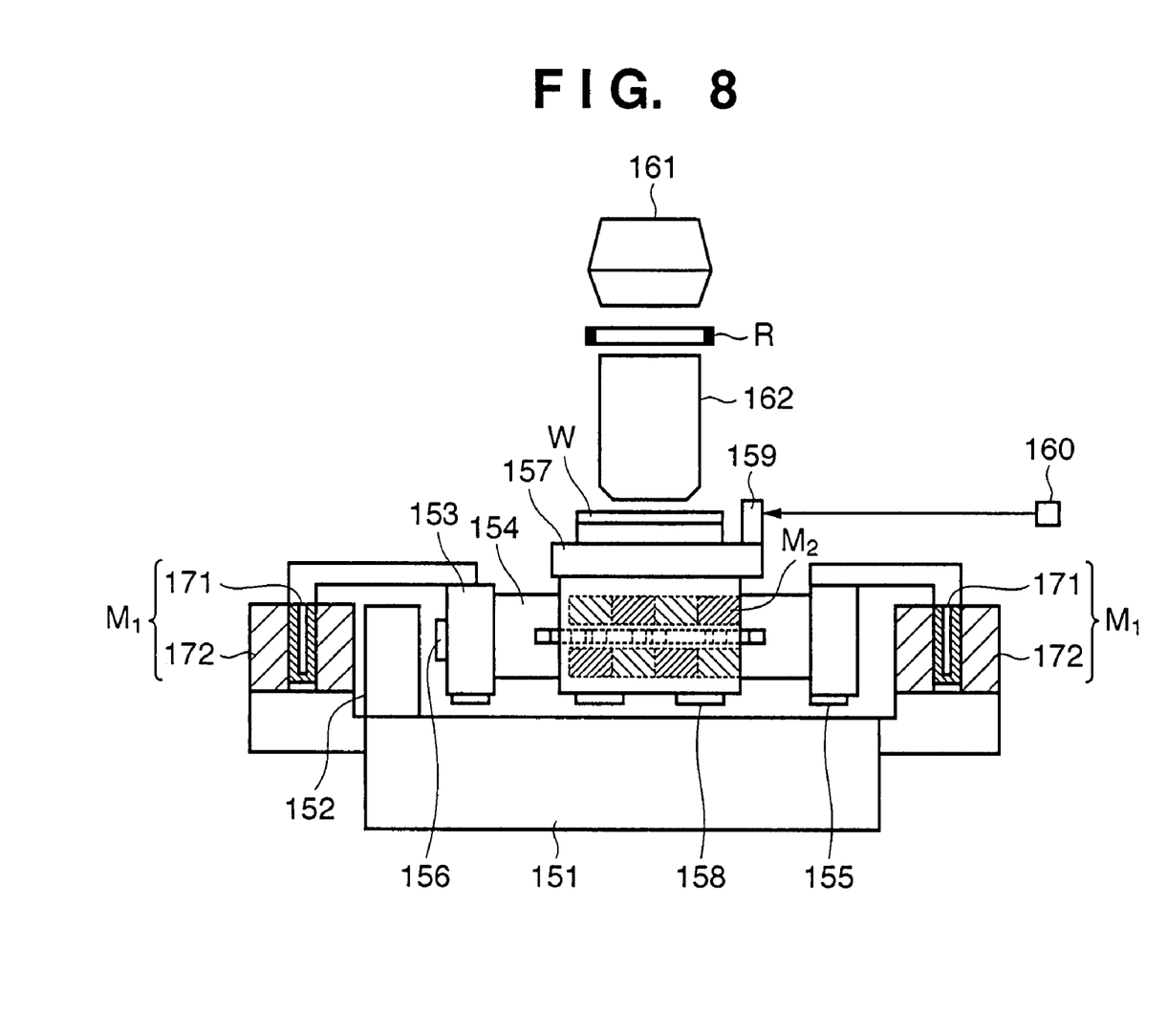
FIG. 8 is a view showing an exposure apparatus according to the third embodiment.

FIG. 8 shows a semiconductor device manufacturing exposure apparatus which uses a stage apparatus similar to that described above as a wafer stage.

This exposure apparatus is used for the manufacture of semiconductor devices such as a semiconductor integrated circuit, and devices such as a micromachine and thin-film magnetic head on which a fine pattern is formed. A semiconductor wafer W as a substrate is irradiated with exposure light (this term is a general term for visible light, ultraviolet light, EUV light, X-rays, an electron beam, a charged particle beam, and the like) as exposure energy from a light source 161 through a reticle R as a master via a projection lens (this term is a general term for a dioptric lens, a reflecting lens, a cata-dioptric lens system, a charged particle lens, and the like) 162 as a projection system, to form a desired pattern on the substrate.

In this exposure apparatus, an upper guide 152 and linear motor stators 172 are fixed on a surface plate 151. The linear motor stators 172 have multi-phase electromagnetic coils, and linear motor movable elements 171 have permanent magnet groups, in the same manner as that described above. The linear motor movable elements 171 are connected as movable portions 153 to movable guides 154 serving as a stage. The movable guides 154 are driven by linear motors M1 and are moved in a direction normal to the surface of the sheet of the drawing. The movable portions 153 are supported by hydrostatic bearings 155 with reference to the upper surface of the surface plate 151, and by a hydrostatic bearing 156 with reference to the side surface of the upper guide 152.

A moving stage 157 serving as a stage arranged across the movable guides 154 is supported by hydrostatic bearings 158. The moving stage 157 is driven by a linear motor M2 similar to that described above. The moving stage 157 moves to the left or right on the surface of the sheet of the drawing with reference to the movable guides 154. The movement of the moving stage 157 is measured by using a mirror 159 fixed to the moving stage 157, and an interferometer 160.

The wafer W as the substrate is held on a chuck mounted on the moving stage 157. The pattern of the reticle R as the master is reduced and transferred by the light source 161 and projection lens 162 onto the respective regions on the wafer W by the step and repeat scheme or step and scan scheme.

Fourth Embodiment

Figure 9:
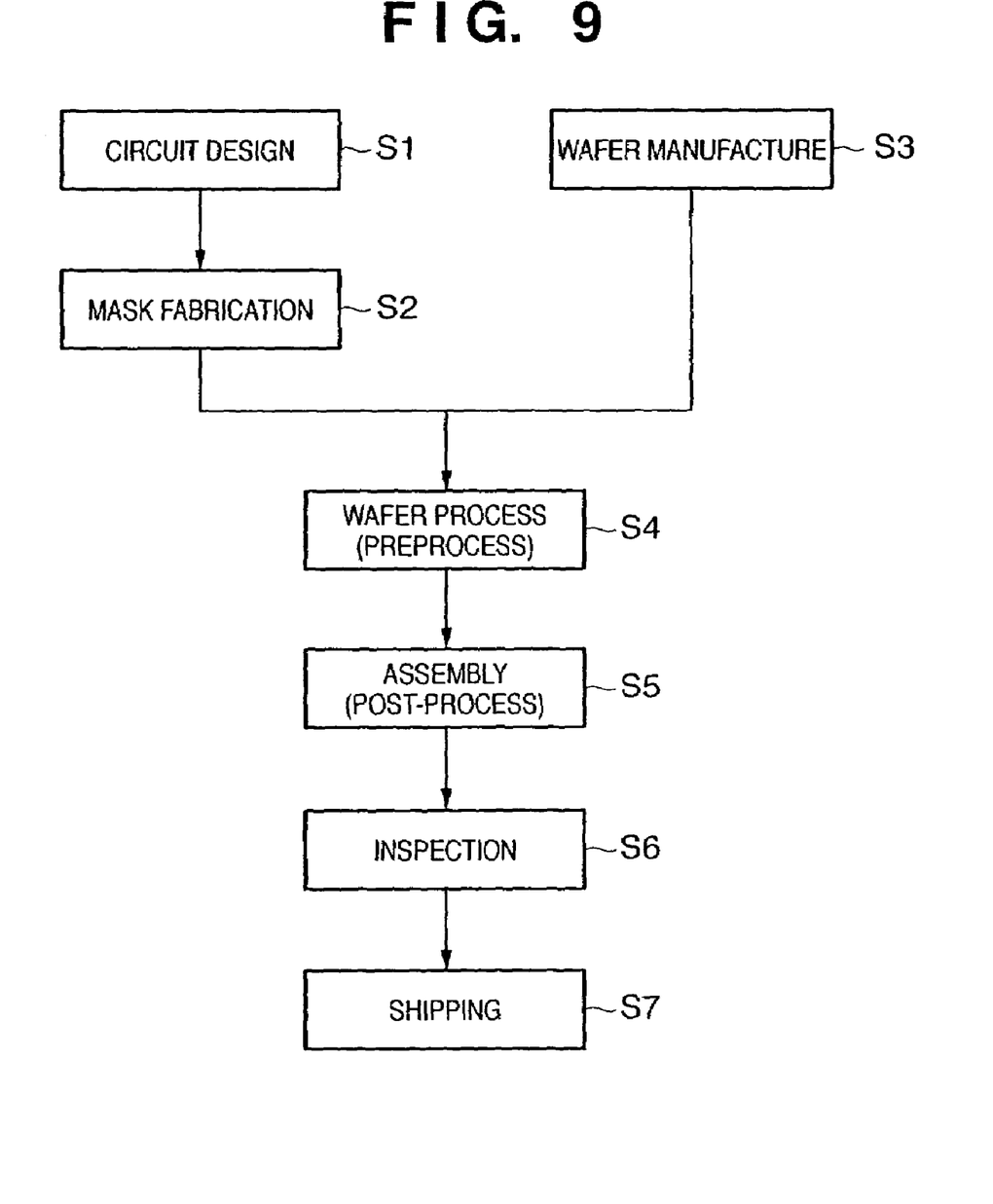
FIG. 9 is a flow chart showing a semiconductor manufacturing process according to the fourth embodiment.

A semiconductor device manufacturing process using the exposure apparatus will be described. FIG. 9 is a flow chart of an overall semiconductor device manufacturing process. In step 1 (circuit design), the circuit of a semiconductor device is designed. In step 2 (mask fabrication), a mask is fabricated based on the designed circuit pattern.

In step 3 (wafer manufacture), a wafer is manufactured using a material such as silicon. In step 4 (wafer process), called a preprocess, an actual circuit is formed on the wafer by the exposure apparatus described above in accordance with lithography using the prepared mask and wafer. In step 5 (assembly) called a post-process, a semiconductor chip is formed from the wafer fabricated in step 4. This step includes processes such as assembly (dicing and bonding) and packaging (chip encapsulation). In step 6 (inspection), inspections such as an operation check test and a durability test of the semiconductor device fabricated in step 5 are performed. A semiconductor device is completed with these processes, and is shipped in step 7.

The wafer process of step 4 has the following steps: the oxidation step of oxidizing the surface of the wafer, the CVD step of forming an insulating film on the wafer surface, the electrode formation step of forming an electrode on the wafer by deposition, the ion implantation step of implanting ions into the wafer, the resist process step of applying a photosensitive agent to the wafer, the exposure step of transferring the circuit pattern to the wafer after the resist process step by the exposure apparatus described above, the developing step of developing the wafer exposed in the exposure step, the etching step of etching portions other than the resist image developed in the developing step, and the resist removing step of removing any unnecessary resist remaining after etching. By repeating these steps, a multi-layered structure of circuit patterns is formed on the wafer.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2003-356630 filed on Oct. 16, 2003, the entire contents of which are hereby incorporated by reference herein.

What is claimed is:

1. A hydrodynamic bearing apparatus for supporting a moving body with respect to a guide, comprising:
   a hydrodynamic bearing which is provided to said moving body and sprays a pressurized fluid to said guide; and
   preload force biasing means for generating a preload force between said moving body and guide,
   wherein said preload force biasing means is arranged dividedly around said hydrodynamic bearing,
   wherein said hydrodynamic bearing apparatus is a hydrodynamic bearing apparatus which supports said moving body in a non-air atmosphere, and
   said hydrodynamic bearing apparatus has a labyrinth partition to surround said hydrodynamic bearing, and said preload force biasing means is arranged inside said labyrinth partition.

2. The apparatus according to claim 1, wherein said labyrinth partition includes a plurality of labyrinth partitions, and said preload force biasing means is arranged inside one of said labyrinth partitions which is the closest to said hydrodynamic bearing.

3. The apparatus according to claim 1, wherein said guide has a magnetic body portion, and said preload force biasing means generates a magnetic force with respect to said guide, thus biasing a preload force.

4. The apparatus according to claim 3, wherein said preload force biasing means has a permanent magnet.

5. The apparatus according to claim 4, wherein a height of said permanent magnet in a support direction is equal to or smaller than a height of said labyrinth partition, provided to said moving body, in the support direction.

6. A stage apparatus wherein a stage is held with a hydrodynamic bearing apparatus according to claim 1.

7. An exposure apparatus wherein a substrate is aligned with a stage apparatus according to claim 6.

8. A device manufacturing method comprising a step of manufacturing a device with an exposure apparatus according to claim 7.

9. A hydrodynamic bearing apparatus for supporting a moving body with respect to a guide, comprising:
   a hydrodynamic bearing which is provided to said moving body and sprays a pressurized fluid to said guide; and
   preload force biasing means for generating a preload force between said moving body and guide,
   wherein said preload force biasing means comprises a plurality of preload force biasing means arranged on each side of at least uni axial direction on said hydrodynamic bearing symmetrically,
   wherein said hydrodynamic bearing apparatus is a hydrodynamic bearing apparatus which supports said moving body in a non-air atmosphere, and
   said hydrodynamic bearing apparatus has a labyrinth partition to surround said hydrodynamic bearing, and said preload force biasing means is arranged inside said labyrinth partition.

10. The apparatus according to claim 9, wherein said guide has a magnetic body portion, and said preload force biasing means generates a magnetic force with respect to said guide, thus biasing a preload force.

* * * * *